US006580317B1

United States Patent
Oppelt

(10) Patent No.: US 6,580,317 B1
(45) Date of Patent: Jun. 17, 2003

(54) LOW-NOISE BROADBAND AMPLIFIER DEVICE HAVING NEGATIVE FEEDBACK VIA A CONTROLLED CURRENT SOURCE, AND USE OF THE AMPLIFIER DEVICE

(75) Inventor: Ralph Oppelt, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 114 days.

(21) Appl. No.: 09/672,630

(22) Filed: Sep. 28, 2000

(30) Foreign Application Priority Data

Sep. 28, 1999 (DE) .......................... 199 46 459

(51) Int. Cl.[7] .............................................. H03F 1/36
(52) U.S. Cl. ........................................... 330/85; 330/86
(58) Field of Search ............................. 330/69, 85, 86, 330/102, 103, 110, 174

(56) References Cited

U.S. PATENT DOCUMENTS

| 3,624,536 | A | | 11/1971 | Norton | .......................... | 330/53 |
| 6,172,561 | B1 | * | 1/2001 | Schott | .......................... | 330/86 |
| 6,323,730 | B1 | * | 11/2001 | Hynd | .......................... | 330/85 |

FOREIGN PATENT DOCUMENTS

DE         4024166         12/1991

OTHER PUBLICATIONS

"Amplifier Application Note", RF & Microwave Signal Processing Components, dated 08/90, pp. 20–21, as mentioned on p. 2 of the specification.
"Rauscharme Verstärkerschaltung", Neues aus der Technik, dated 1979, No. 3, p. 2, pertains to a low–noise amplifier circuit, as mentioned on p. 3 of the specification.
"Halbleiterschaltungstechnik", Springer Verlag, $9^{th}$ edition, dated 1991, pp. 44–49 and 132–137 pertains to a semiconductor circuitry, as mentioned on p. 2 of the specification.

* cited by examiner

Primary Examiner—Steven J. Mottola
(74) Attorney, Agent, or Firm—Laurence A. Greenberg; Werner H. Stemer; Ralph E. Locher

(57) ABSTRACT

An amplifier includes a first broadband amplifier element (20) having a first and a second input (21 and 22, respectively) and also a first output (23). The first output (23) is fed back via a first and a second negative feedback path (30 and 40, respectively) to the first and second input (21 and 22, respectively). The first negative feedback path (30) includes a controlled current source (31), which brings about a reduction in the noise contribution of the second negative feedback path (40) and also a real finite input impedance.

13 Claims, 4 Drawing Sheets

LOW-NOISE BROADBAND AMPLIFIER DEVICE HAVING NEGATIVE FEEDBACK VIA A CONTROLLED CURRENT SOURCE, AND USE OF THE AMPLIFIER DEVICE

BACKGROUND OF THE INVENTION

Field of the Invention

The invention relates to a low-noise, broadband amplifier device having at least a first broadband amplifier element having negative feedback. The invention additionally relates to the use of the amplifier device.

Such an amplifier device is employed for example as an amplifier of an ultrasonic apparatus, magnetic resonance apparatus or of a radio-frequency measuring apparatus. In the amplifier device, an electrical signal which, for example, is generated by an ultrasonic transducer in response to a received acoustic signal, may have a very low signal level, and is in this case amplified for subsequent signal processing (not specifically described here). To ensure that the information content is not diminished unnecessarily this amplification should be effected with as little noise as possible.

The reference book U. Tietze, Ch. Schenk, "*Halbleiter-Schaltungstechnik*" [*Semiconductor circuitry*], Springer-Verlag, 9th edition, 1991, pages 44 to 49 and also 132 to 137 discloses various amplifier devices which include, in addition to at least one active amplifier element, such as a transistor or an operational amplifier, at least one further element for connecting up the amplifier element. In order to eliminate the nonlinearity of the active element and, in particular, also to set a defined gain and input impedance, use is often made here of the circuit principle of negative feedback.

The negative feedback is usually effected via a non-reactive resistor. However, since a non-reactive resistor generates thermal noise, the originally good noise properties of the active amplifier element are significantly impaired by the resistive negative feedback.

In order to avoid this negative effect of resistive negative feedback, inductive transformer-based negative feedback is provided instead in the case of the amplifier devices respectively described in the Company catalog of Adams-Russell Co. Inc. "RF&Microwave Signal Processing Components" in the section "Amplifier Application Note" on pages 20 and 21 and in U.S. Pat. No. 3,624,536. A very good noise behavior can thus also be achieved for the amplifier device overall, since a transformer is a very low-loss and low-noise element. However, a transformer is relatively expensive and also rather large, so that it can only be integrated with difficulty.

The technical paper "*Rauscharme Verstärkerschaltung*" [*Low-noise amplifier circuit*], Neues aus der Technik, 1979, No. 3, 15.06.1979, p. 2 describes a low-noise amplifier device in which the output of an amplifier element is fed back via a first and a second negative feedback path to the two inputs. One negative feedback path includes a resistor and the other a voltage-controlled voltage source. An inverting differential amplifier is thus produced overall which has an improved noise behavior compared with an inverting differential amplifier connected up in a conventional manner. However, the resistor in the first negative feedback path still supplies a finite contribution to the total noise of the amplifier device. This is because the input of the amplifier device is connected up directly to the resistor.

Moreover, DE 40 24 166 C1 discloses an amplifier device having capacitive negative feedback which is likewise distinguished by a good noise behavior. This is because the capacitors used in this case also have very little noise. What is unfavorable, by contrast, is that the gain of the disclosed amplifier device having capacitive and negative feedback is greatly dependent on the frequency and on the load.

However, an amplifier device having a high bandwidth is favorable precisely when used in an ultrasonic apparatus, because of the requirements of being able to connect to different ultrasonic transducers, in particular those having center frequencies that differ from one another. The required bandwidth may in this case be of the order of magnitude of at least two decades.

Furthermore, the known amplifier devices often have a very high and occasionally also an undefined input impedance. The input impedance is typically at least $10^4$ $\Omega$. This has an unfavorable effect with regard to power matching of the amplifier device to a source resistance of the ultrasonic transducer connected to the input. This source resistance is of the order of magnitude of a few 10 $\Omega$. If appropriate, the connected ultrasonic transducer may also be provided with a simple matching circuit which transforms the source resistance to a standard value of e.g. 200 $\Omega$. However, this value is significantly below the value which is customary for the input impedance of the known amplifier devices. Apart from the power transfer which is not optimum in that case, the high or undefined input impedance can additionally also lead to a deterioration in the noise behavior. Furthermore, standing wave effects can occur, leading to undesirable distortion.

SUMMARY OF THE INVENTION

It is accordingly an object of the invention to provide an amplifier which overcomes the hereinafore-mentioned disadvantages of the heretofore-known methods and devices of this general type in such a way that the gain of the amplifier is as independent of frequency as possible in a wide frequency range, and the amplifier has a defined real input impedance. Moreover, the intention is for the amplifier device to have as little noise as possible and to be readily integratable. In particular, the intention is also to eliminate the noise contribution of the negative feedback.

With the foregoing and other objects in view there is provided, in accordance with the invention, a low-noise, broadband amplifier, that includes a first broadband amplifier element having a first input, a second input, and a first output. A first negative feedback path is fed back from the first output to the first input, a second negative feedback path is fed back from the first output to the second input, and a controlled current source is disposed in the first negative feedback path.

In this case, the invention is based on the insight that, by means of a controlled current source in the first negative feedback path, it is possible both for the noise contribution of the second negative feedback path, required for setting the gain, to be reduced and for a real finite input impedance to be set. What has a particularly favorable effect in this case is that the setting of the real finite input impedance does not require an additional non-reactive resistor, the thermal noise of which would result in the noise behavior of the entire amplifier device also being impaired. Specifically, the controlled current source in the first negative feedback path has the effect that a virtual input impedance having a real and finite value forms at the input of the amplifier device. In particular, this does not require a resistive connection in parallel with the input of the amplifier device. The advantage of matching to the source resistance of a unit, for example an ultrasonic transducer, connected upstream of the amplifier device is thus accompanied by an improvement in the noise behavior.

Without any restriction to the general validity, the effect of the controlled current source in the first negative feedback path will now be explained for the case where the first amplifier element having negative feedback via the second negative feedback path is an operational amplifier connected up in a non-inverting fashion. The ideally infinite input impedance of the non-inverting operational amplifier can now be transferred by the controlled current source into an input impedance having a finite and real value. Specifically, the controlled current source converts the output voltage of the amplifier device into a current which appears, at the input of the amplifier device, as an input current which is proportional to the output voltage. On account of the proportional relationship—determined by the gain—between the input voltage and the output voltage, a proportional relationship between the input current and the input voltage thus also results, that is to say a finite real input resistance.

Instead of the voltage-controlled current source used in the exemplary embodiment described above, however, it is equally possible to use a current-controlled current source. To that end, by way of example, a portion of the output voltage which is to be fed back in the manner of negative feedback is converted into a proportional current signal, which then serves as a control variable. Irrespective of the nature of its respective control, the current source can be embodied, without difficulty, with the high bandwidth required for the amplifier device.

The bandwidth of the amplifier device is otherwise determined principally by the first amplifier element, which, in particular, may be designed as a broadband transistor or operational amplifier. In the last-mentioned case, an embodiment is possible in the form of a component integrated on a chip or alternatively in the form of a discrete structure having a plurality of individual components. However, a bandwidth of at least two frequency decades can readily be realized in each embodiment.

In accordance with an added feature of the invention, a favorable embodiment variant is provided in which the current source is voltage-controlled. As already described above, this makes it possible, in a particularly simple manner, for an output voltage of a non-inverting operational amplifier to be converted into a finite input current of the amplifier device.

In accordance with an additional feature of the invention, a further embodiment variant is provided in which the first negative feedback path also includes a first voltage divider in addition to the controlled current source. Specifically, that portion of the current supplied by the controlled current source which appears at the input of the amplifier device can be set with the aid of the first voltage divider. The voltage divider also simultaneously serves as a current divider. The desired value for the real input impedance of the amplifier device can then be set very accurately by way of the divider ratio. It is particularly favorable if the first voltage divider includes at least a series circuit formed by a first and a second divider capacitor, since the divider capacitors do not generate thermal noise comparable to that of a non-reactive resistor. The frequency dependence of the two divider capacitors is not manifested on account of the behavior determined exclusively by the division ratio, so that practically no concessions at all result in the bandwidth which can be attained.

In accordance with another feature of the invention, a further embodiment is provided in which the second negative feedback path includes a second voltage divider, which sets the gain of the amplifier device independently of the optionally non-linear properties of the first amplifier element. The gain is determined exclusively by the ratio of the two impedances of the second voltage divider, the impedances being connected in series. One example of this is the operational amplifier connected up in a non-inverting fashion. A capacitively designed second voltage divider once again enables a particularly favorable noise behavior to be achieved. The second voltage divider then includes at least a series circuit formed by a third and a fourth divider capacitor. In order to prevent undesirable charging at the second input, the third and the fourth divider capacitors or just one of the two divider capacitors mentioned may, if appropriate, also be bridged resistively. In this case, this bridging may have an arbitrarily high resistance. The bridging resistors that may be present are unimportant for the noise since they are short-circuited by the third and/or fourth divider capacitor in the signal frequency range of interest.

In accordance with a further feature of the invention, another embodiment is provided in which the current source is controlled by means of a current. A current-inverting negative impedance converter, which is also referred to as INIC, is provided, in particular, for this purpose. The leading "I" in this case denotes current inversion and the rest is an abbreviation of the English term "Negative Impedance Converter". An INIC is particularly well suited to use in the first negative feedback path, specifically because a current flows both from the input and from the output of the amplifier device into the first negative feedback path. Therefore, it is precisely an element having current inversion that is required. A circuit which, apart from an inductive transformer—which is undesirable on account of its large physical form—is constructed only with passive components cannot offer this function.

In accordance with another added feature of the invention, a further favorable variant is provided in which the current-inverting negative impedance converter includes a second broadband amplifier element, for example again in the form of an operational amplifier. The broadband embodiment ensures that the amplifier device overall can be used in a wide frequency range. A second output is fed back in each case to a third and a fourth input of the second amplifier element. The favorable current-inverting effect of the negative impedance converter is thereby achieved.

In accordance with another additional feature of the invention, another embodiment is provided in which the second negative feedback path includes a second voltage divider which, particularly when a current-inverting negative impedance converter is used in the first negative feedback path, may also be designed purely resistively with a series circuit formed by a first and second non-reactive divider resistor. The current-inverting negative impedance converter has the positive property of at least partly suppressing the noise contribution of the two non-reactive divider resistors. Moreover, the gain of the amplifier device can be set very accurately by means of the non-reactive divider resistors, which are also highly suitable for integration.

An embodiment in which the non-reactive divider resistors have an identical resistance is particularly advantageous. This embodiment is distinguished by the fact that the noise contributions of the two divider resistors and the voltage noise of the first amplifier element are completely suppressed by the current-inverting negative impedance converter.

In accordance with yet another added feature of the invention, there is provided a further embodiment in which a finite real input impedance is produced that can be set by appropriate connection of the two negative feedback paths. A finite real input impedance of 50 ohms or of 200 ohms is particularly favorable precisely in the case of an ultrasonic transducer connected upstream of the amplifier device because the source impedance of the ultrasonic transducer has this value or can be transformed without difficulty to these resistance values. Reflection-free matching is thus achieved in conjunction with low inherent noise of the amplifier device.

Because of the favorable noise behavior and the input impedance which can be adapted to a predetermined value of a source resistance, the amplifier device can be used particularly advantageously in an ultrasonic apparatus. It then serves, in particular, as a preamplifier which is matched to an ultrasonic transducer connected upstream and preamplifies an output signal of the ultrasonic transducer with particularly little noise for further processing. Use in a magnetic resonance apparatus or in a radio-frequency measuring apparatus is likewise possible. In these apparatuses, too, a good noise behavior and an adjustable real input impedance are favorable properties of a preamplifier that is used, particularly when these properties apply over a large frequency range, as in the case of the amplifier device.

Other features which are considered as characteristic for the invention are set forth in the appended claims.

Although the invention is illustrated and described herein as embodied in a low-noise broadband amplifier device having negative feedback via a controlled current source, and use of the amplifier device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
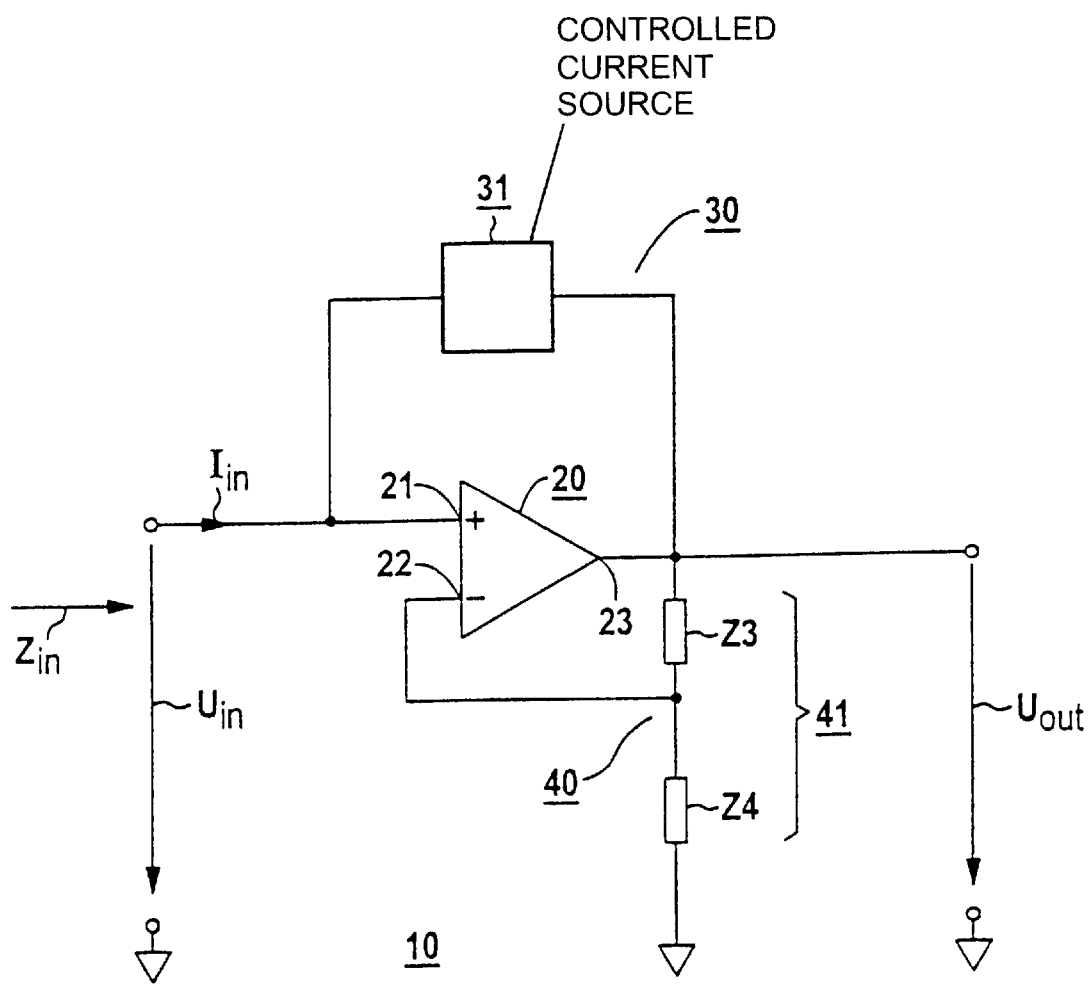
FIG. 1 shows an amplifier device having negative feedback via a controlled current source.

Referring to the figures of the drawing in detail and first, particularly, to FIG. 1 thereof, there is shown an amplifier device 10 including a first amplifier element 20 having a high bandwidth, in which the amplifier element has double negative feedback. In this case, the first amplifier element 20 is an operational amplifier having a first non-inverting input 21, a second inverting input 22 and a first output 23. The first output 23 is fed back via a first negative feedback path 30 and also via a second negative feedback path 40 to the first and second inputs 21 and 22, respectively. An input voltage present at the input of the amplifier device 10 is designated by $U_{in}$, an input current is designated by $I_{in}$, an input impedance of the amplifier device 10 is designated by $Z_{in}$ and an output voltage present at the output of the amplifier device 10 is designated by $U_{out}$. In this case, the first input 21 and the first output 23 of the first amplifier element 20 in each case also form the input and output, respectively, of the amplifier device 10.

The second negative feedback path 40 includes a voltage divider 41 comprising a series circuit formed by a first and a second divider impedance Z3 and Z4, respectively. A tap between the two divider impedances Z3 and Z4 is electrically conductively connected to the second input 22. This connection corresponds to the known non-inverting negative feedback of an operational amplifier. A gain V is then determined by the two divider impedances Z3 and Z4 as:

$$V = \frac{U_{out}}{U_{in}} = 1 + \frac{Z3}{Z4} \tag{1}$$

Without the first negative feedback path 30, the amplifier device 10 would have an input impedance $Z_{in}$ that would be infinite in the theoretical limiting case. Moreover, the two divider impedances Z3 and Z4 are usually designed as non-reactive divider resistors R3 and R4, respectively, with the result that the amplifier device 10 has a considerable inherent noise on account of the thermal noise of these two non-reactive divider resistors R3 and R4. Assuming that the negative feedback path 30 is not present, and that the two divider impedances Z3 and Z4 constitute purely non-reactive divider resistors R3 and R4, respectively, their results for the amplifier device 10 a noise factor F of $$F = 1 + \frac{p_n}{4kT}\left[\frac{r_n}{R_q} + \frac{R_q}{r_n}\left(1 + \frac{R34}{R_q}\right)^2\right] + \frac{R34}{R_q} \tag{2}$$

where $p_n$ designates an equivalent noise input power density and $r_n$ designates an equivalent noise input resistance, which can be determined from known noise characteristic quantities (=equivalent input noise voltage density and input noise current density) of the first amplifier element 20. Furthermore, k denotes Boltzmann's constant, T denotes the ambient temperature, $R_q$ denotes a real source resistance of a unit connected upstream of the amplifier device 10 and R34=R3·R4/R3+R4 denotes a resistance that would result from R3 and R4 being connected in parallel.

The analysis of equation (2) reveals that the conditions R34<<$R_q$ and $r_n$=$R_q$ should be met for a noise factor F that is as small as possible. The second condition can be achieved by selecting or designing a first amplifier element 20 with a corresponding equivalent noise input resistance $r_n$. By contrast, very small non-reactive divider resistors R3 and R4 should be chosen for the first condition. However, this leads to a not inconsiderable current flow in the second negative feedback path 40, as a result of which the power demand of the amplifier device 10 and also the signal distortion in the output voltage $U_{out}$ then increase. Both are undesirable.

The first negative feedback path 30 therefore includes a controlled current source 31, which, on the one hand, sets a finite and real input impedance $Z_{in}$ and, on the other hand, at least reduces or even completely eliminates the noise contribution of the voltage divider 41 in the second negative feedback path 40. This is done, in particular, without the above-described negative accompanying phenomena, such as high power demand or high signal distortion.

Figure 2:
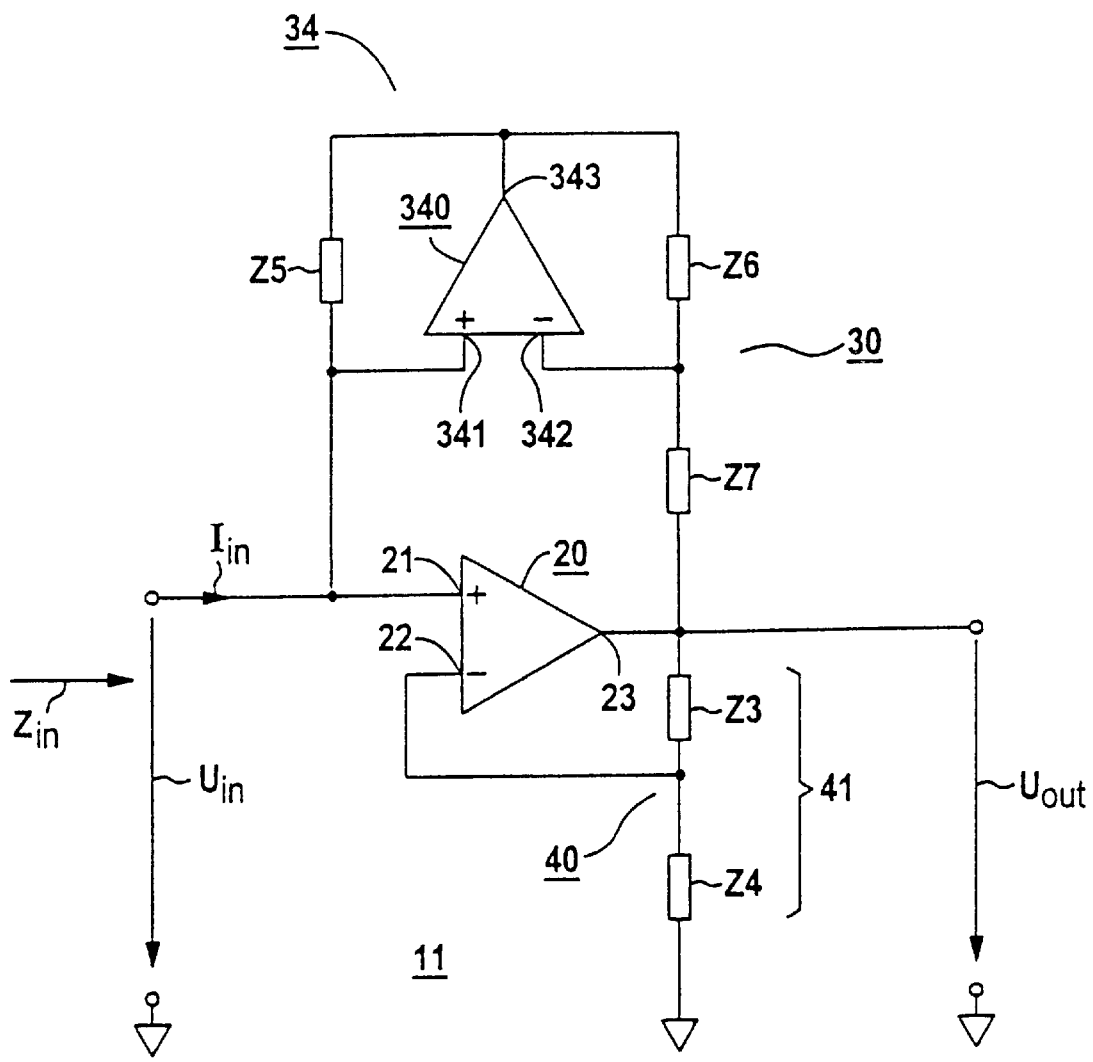
FIG. 2 shows an amplifier device having negative feedback via a current-inverting negative impedance converter.

FIG. 2 illustrates an amplifier device 11 including a concrete embodiment of the controlled current source 31 shown in FIG. 1. This is a current-controlled current source in the form of a current-inverting negative impedance converter 34, which is also referred to by the abbreviation INIC. This current-inverting negative impedance converter 34 is composed of a likewise broadband second amplifier element 340 having a third and a fourth input 341 and 342, respectively, and also a second output 343. The second output 343 is fed back via a first INIC impedance Z5 to the third input 341 and via a second INIC impedance Z6 to the fourth input 342. The fourth input 342 is additionally connected to the first output 23 of the first amplifier element 20 via a third INIC impedance Z7.

The negative impedance converter 34 effects current inversion, so that a current can flow both from the input and from the output of the amplifier device 11 into the negative impedance converter 34. A finite input current $I_{in}$ is thus set at the input of the amplifier device 11, which input current is, moreover, proportional to the input voltage $U_{in}$. The input impedance $Z_{in}$, which is then finite and real, is calculated taking account of the gain V in accordance with equation (1) as:

$$Z_{in} = Z5 \cdot \frac{Z7}{Z6} \cdot \frac{1}{V-1} \quad (3)$$

In order to introduce as little thermal noise as possible, it is favorable for either the two INIC impedances Z6 and Z6 or the two INIC impedances Z6 and Z7 to be dimensioned in a complex fashion, in particular purely capacitively. This results in the first negative feedback path 30 having only a very small noise contribution. In addition, the frequency responses of the two capacitively chosen INIC impedances Z5 and Z6 or Z6 and Z7 cancel one another out again on account of the ratio formation which is evident from equation (3).

Figure 3:
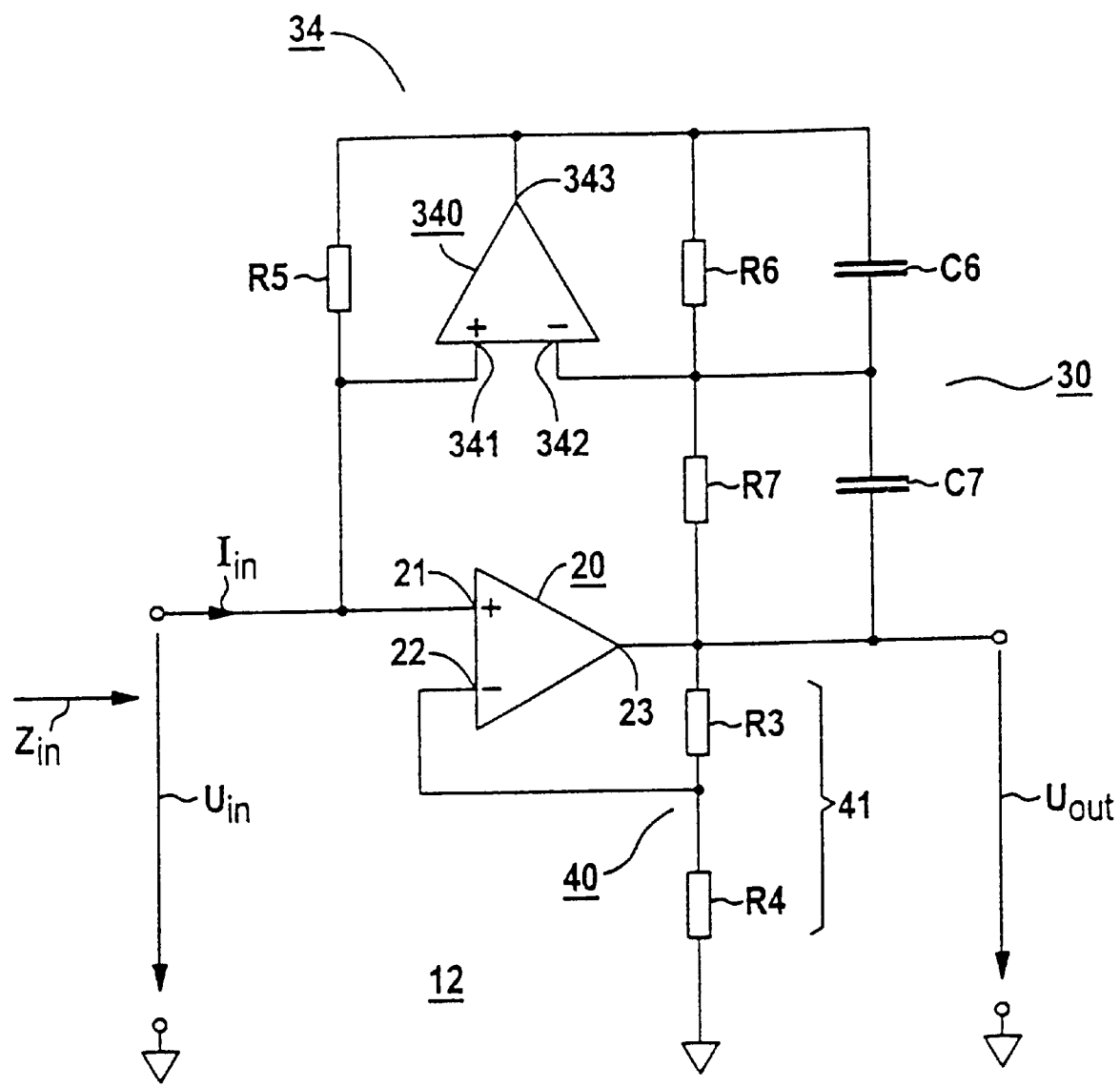
FIG. 3 shows an exemplary embodiment of the amplifier device of FIG. 2.

FIG. 3 shows an amplifier device 12 representing a concrete example of the realization of the amplifier device 11 of FIG. 2. The first INIC impedance Z5 is designed as a purely non-reactive first INIC resistor R5. The second and third INIC impedances Z6 and Z7, respectively, are in each case embodied as a parallel circuit formed by a second non-reactive INIC resistor R6 and a first INIC capacitor C6 and, respectively, a third non-reactive INIC resistor R7 and a second INIC capacitor C7. The two non-reactive INIC resistors R6 and R7 serve for DC voltage negative feedback. However, their value may be chosen to be so high that their noise contribution is short-circuited by the two INIC capacitors C6 and C7, respectively, in the desired frequency range. In this case, the purely resistive voltage divider 41 includes a first and a second non-reactive divider resistor R3 and R4, respectively.

The two amplifier elements 20 and 340 are each embodied as operational amplifiers which are designed in accordance with the required inherent noise and in accordance with the required bandwidth. The first INIC resistor R5 assumes a value of 1.4 kΩ, the second INIC resistor R6 a value of 70 kΩ, the third INIC resistor R7 a value of 10 kΩ, the first INIC capacitor C6 a value of 20 pF, the second INIC capacitor C7 a value of 140 pF, and the two non-reactive divider resistors R3 and R4 a value of 1 kΩ, in each case. A real input impedance $Z_{in}$ of 200 Ω is thus obtained, which, consequently, is very well matched to a customary source resistance $R_q$ of an ultrasonic transducer which is connected upstream of the amplifier device 12 but is not illustrated in FIG. 3. Moreover, the amplifier device 12 can be operated in a frequency range of from 0.5 to 20 MHz. It is thus suitable for different ultrasonic transducers having, in particular, different center frequencies in the frequency range mentioned.

Furthermore, the amplifier device 12 is also distinguished by a very good noise behavior in the frequency range mentioned. This can be seen in the course of investigating the noise contribution of the two non-reactive divider resistors R3 and R4 in the output voltage $U_{out}$. A noise contribution which is proportional to $$\frac{V-2}{2(V-1)} \text{ and } 1 - \frac{V}{2} \quad (4)$$

results for the two divider resistors R3 and R4, respectively. It is evident from this that both noise contributions each tend toward zero if the gain V in accordance with equation (1) assumes the value 2, that is to say if the two divider impedances Z3 and Z4 which are designed here as purely non-reactive divider resistors R3 and R4 are chosen to have identical magnitudes. In that case, the requirement—established in connection with equation (2)—for the smallest possible non-reactive divider resistors R3 and R4 also need no longer be taken into account. As long as the condition R3=R4 is met, the two non-reactive divider resistors R3 and R4 can assume a value which is upwardly unlimited in principle, with the result that the current flow in the second negative feedback path 40 can be kept small without difficulty. This results not only in a real input impedance $Z_{in}$ and little inherent noise but also in a low power consumption and little signal distortion.

The negative feedback via the current-inverting negative impedance converter 34 in the first negative feedback path 30 renders the noise of the two non-reactive divider resistors R3 and R4 ineffective for the case where the gain is V=2. This is because each voltage source connected in series with the first and second input 21 and 22, respectively, of the first amplifier element 20 is suppressed at the first output 23. Since the inherent voltage noise of the first amplifier element 20 is described precisely by a respective equivalent voltage noise source connected in series with one of the two inputs 21 and 22, no noise component caused by the first amplifier element 20 therefore appears at the output 23. However, it is favorable when this suppression at the output 23 does not apply to the input voltage $U_{in}$ to be amplified, since it is not connected in series but rather in parallel with the first input 21.

Figure 4:
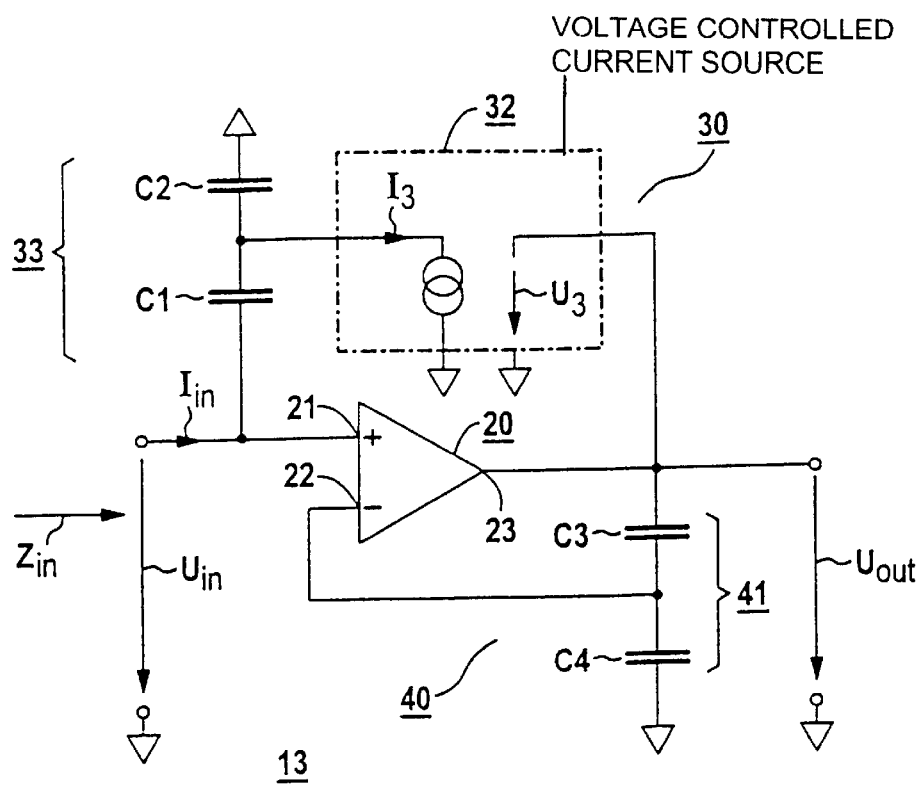
FIG. 4 shows an amplifier device having negative feedback via a voltage-controlled current source.

FIG. 4 represents a further amplifier device 13, which includes, in the first negative feedback path 30, a voltage-controlled current source instead of the current-controlled current source used in the amplifier devices 11 and 12. In this case, an input voltage $U_3$ leads to a proportional output current I3. The output voltage $U_{out}$ of the amplifier device 13 serves as the input voltage $U_3$. The voltage-controlled current source 32 is connected to the input of the amplifier device 13 via a first divider capacitor C1 of a voltage divider 33, which additionally includes a second divider capacitor C2. A finite input current $I_{in}$ therefore appears at the input of the amplifier device 13, which input current is also proportional to the input voltage $U_{in}$ on account of the proportionality relationships between $U_{in}$ and $U_{out}$ (see equation (1)), between $U_{out}$ and $U_3$ and between $U_3$ and I3 and also in accordance with the divider ratio chosen for the voltage divider 33. A desired real value can thus be set for the input impedance $Z_{in}$ by way of the dimensioning of the proportionality relationships and of the divider ratio.

Since the voltage divider 41 includes a third and a fourth divider capacitor C3 and C4, respectively, and is thus designed purely capacitively exactly like the voltage divider 33, the amplifier device 13 is also distinguished by a good noise behavior. Thermal noise does not occur.

The amplifier device 13 is additionally suitable for broadband use since only the respective divider ratios influence the response and the frequency dependencies of the divider capacitors C1 to C4 thus compensate for one another. A bandwidth of at least two decades can thus readily be achieved.

Figure 5:
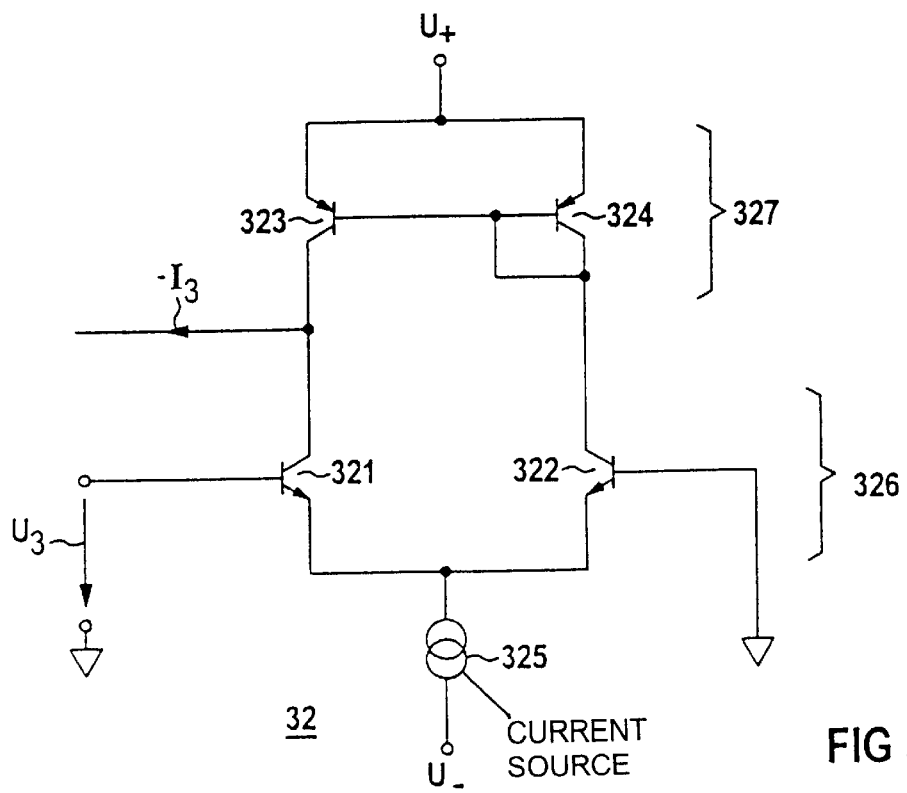
FIG. 5 shows a voltage-controlled current source.

This is because the voltage-controlled current source 32 can also be embodied in a both broadband and low-noise fashion. A corresponding realization example is shown in FIG. 5. The voltage-controlled current source includes a differential amplifier 326 formed by two bipolar npn transistors 321 and 322, and a current mirror 327 formed by two bipolar pnp transistors 323 and 324. The current mirror 327 compels an identical current flow at the collector terminals of the transistors 323 and 324 of the differential amplifier 326. A current difference between the current flow at the collector terminal of the transistor 321 and the current flow at the collector terminal of the transistor 322 is consequently precisely equal to the output current I3. A bias current source 325 connected to the emitter terminals of the transistors 321 and 322 provides for a constant current flow via the differential amplifier 326. If appropriate, in order to improve the linearity, the emitter terminals of the transistors 321 and 322 may also be connected to the bias current source 325 via a respective non-reactive resistor. The voltage-controlled current source 32 is fed by means of a positive and a negative supply voltage $U_+$ and $U_-$, respectively.

A voltage change in the input voltage $U_3$ at the base terminal of the transistor 321 leads to a corresponding output current I3 on account of the current equality compelled by the current mirror 327 at the collector terminals of the transistors 322 and 323. The voltage-controlled current source 32 shown in FIG. 5 can be embodied in a both broadband and low-noise fashion by suitable selection of the transistors 321 to 324. In addition, the voltage-controlled current source 32 is very well suited to integration. The preconditions for use in the amplifier device 13 of FIG. 4 are thus given.

I claim:

1. A low-noise, broadband amplifier, comprising:
   an amplifier input;
   a first broadband amplifier element having a first input, a second input, and a first output;
   a first negative feedback path fed back from said first output to said first input, said first negative feedback path and said first input connected to said amplifier input, said first negative feedback path being configured to receive an input current fed to said amplifier input;
   a second negative feedback path fed back from said first output to said second input; and
   a controlled current source disposed in said first negative feedback path.

2. The amplifier according to claim 1, wherein said controlled current source is a voltage-controlled current source.

3. The amplifier according to claim 1, comprising a voltage divider disposed in said first negative feedback path.

4. The amplifier according to claim 1, comprising a purely capacitive voltage divider disposed in said first negative feedback path, said voltage divider including a first capacitor and a second capacitor connected in series.

5. The amplifier according to claim 1, comprising a voltage divider disposed in said second negative feedback path.

6. The amplifier according to claim 1, comprising a purely capacitive voltage divider disposed in said second negative feedback path, said voltage divider including a first capacitor and a second capacitor connected in series.

7. The amplifier according to claim 1, wherein said controlled current source is a current-inverting negative impedance converter.

8. The amplifier according to claim 7, wherein said current-inverting negative impedance converter includes a broadband amplifier element defined as a second broadband amplifier element, said second broadband amplifier element having a first input, a second input, and an output, said output of said second broadband amplifier element being fed back to said first input of said second broadband amplifier element and to said second input of said second broadband amplifier element.

9. The amplifier according to claim 1, comprising a purely resistive voltage divider disposed in said second negative feedback path, said voltage divider including a first non-reactive divider resistor and a second non-reactive divider resistor connected in series.

10. The amplifier according to claim 9, wherein said first non-reactive divider resistor and said second non-reactive divider resistor have identical resistances.

11. The amplifier according to claim 1, wherein said amplifier input has a finite real input impedance.

12. The amplifier according to claim 1, wherein said amplifier input has a finite real input impedance selected from the group consisting of 50 ohms and 200 ohms.

13. A method of using a low-noise broadband amplifier, which comprises:
   providing a low-noise, broadband amplifier, that includes:
      an amplifier input;
      a first broadband amplifier element having a first input, a second input, and a first output;
      a first negative feedback path fed back from said first output to said first input, the first negative feedback path and the first input connected to the amplifier input, the first negative feedback path being configured to receive an input current fed to the amplifier input;
      a second negative feedback path fed back from the first output to the second input; and
      a controlled current source disposed in the first negative feedback path; and
   using the low-noise, broadband amplifier to amplify a signal from an apparatus selected from the group consisting of an ultrasonic apparatus, a magnetic resonance apparatus and a radio-frequency measuring apparatus.

* * * * *